United States Patent [19]
Knoll

[11] Patent Number: 5,357,204
[45] Date of Patent: Oct. 18, 1994

[54] ONE-SHOT CLOCK GENERATOR CIRCUIT

[75] Inventor: Ernest Knoll, Tirat Hacarmel, Israel

[73] Assignee: Intel Corporation, Santa Clara, Calif.

[21] Appl. No.: 115,233

[22] Filed: Sep. 1, 1993

[51] Int. Cl.$^5$ ............................................. H03K 3/00
[52] U.S. Cl. ...................................... 328/62; 328/57; 328/55; 307/260; 307/202; 307/268; 307/271
[58] Field of Search .............................. 328/57, 55, 62; 307/260, 262, 265, 268, 266, 271

[56] References Cited

U.S. PATENT DOCUMENTS

| | | | |
|---|---|---|---|
| 4,283,639 | 8/1981 | Roester | 328/62 |
| 4,985,639 | 7/1989 | Renfrow et al. | 328/55 |
| 5,163,168 | 3/1991 | Hirano et al. | 307/260 |

Primary Examiner—William L. Sikes
Assistant Examiner—Fetsum Abraham
Attorney, Agent, or Firm—Blakely, Sokoloff, Taylor & Zafman

[57] ABSTRACT

A circuit for generating two internal clocking signals with non-overlapping phases at the frequency of an input external clock. A differentiator means receives a first digital signal and outputs a first digital pulse coupled to a first input of a flip-flop means, causing the flip-flop means to enter a first logic state. A first output of the flip-flop means is provided to an inverter means, which outputs a first internal clocking signal. A second output of the flip-flop means is provided to a second inverter means, which outputs a second internal clocking signal. A reset means is coupled to receive the second output of the flip-flop means and the output of the differentiator means. The reset means provides an output coupled to a second input of the flip-flop means, the reset means provides a second digital pulse in response to a transition in logic state of the second output of the flip-flop means when the flip-flop means enter the first logic state, thereby causing the flip-flop means to enter a second logic state.

22 Claims, 4 Drawing Sheets

Phase-Locked Loop*
Prior Art

ONE-SHOT CLOCK GENERATOR CIRCUIT

BACKGROUND OF THE INVENTION

1. Field of the Invention

The present invention relates to the field of integrated circuit design. More specifically, the invention relates to circuits for generating clocking signals within computers and other electronic systems.

2. Description of Related Art

Electronic systems utilize various types of clocking signals to provide required timing functions. Generally, an integrated circuit (IC) is provided with an external clocking signal from which multiple internal clocking signals for the IC are derived. However, the external clocking signal often does not have a well-defined duty cycle. It therefore becomes necessary to provide internal clocking signals at the same frequency as the external clock which are not dependent upon the duty cycle of the external clock. Circuits which perform this function typically consist of closed-loop solutions such as phase-locked loops (PLL), delay-locked loops (DLL) or synchronous delay loops (SDL).

FIG. 1 provides a block diagram of a representative PLL circuit. The PLL uses a phase/frequency detector (PFD) 102 to measure the error in phase/frequency between the input signal EXT CLK and the generated output signal INT CLK. The PFD 102 generates pulses on either a LEAD or LAG output, depending on the relative phase difference between EXT CLK and INT CLK, causing the charge pumps 104 to either charge or discharge, respectively. The output of charge pumps 104 is then passed through a low pass filter 106 and provided as the control voltage VCNTL for a voltage controlled oscillator (VCO) 108. The control voltage VCNTL causes VCO 108 to adjust its output frequency until there is no phase/frequency error between EXT CLK and INT CLK. In steady-state, the generated output INT CLK will be locked to the phase of the input EXT CLK.

The closed-loop solutions may pose a design problem, however, when used in certain applications where power consumption is critical, such as in laptop computers or cellular telephones. In order to reduce power consumption, these applications often employ "power down" techniques, which include temporarily "powering down" or disabling individual subcircuits within a system when they are not in use, lowering the external clock frequency or, in cases of prolonged inactivity, stopping the external clock completely. Unfortunately, PLL, DLL and SDL circuits do not provide instantaneous recovery once the external clock is re-established or its frequency restabilized. These circuits typically require between 500 and 1500 external clock cycles to become resynchronized to the external clock. During this "lock-in" time, these closed-loop circuits commonly generate spurious signals and glitches, leading to unpredictable results from any circuitry which receives clocking signals from these circuits.

The long lock-in time associated with closed-loop clocking circuits is the result of a design trade-off between circuit stability and lock-in time. Specifically, lock-in time may be improved (reduced) by increasing the bandwidth of the closed-loop system. Referring again to FIG. 1, the system bandwidth of the PLL can be adjusted by appropriately selecting the gains of phase/frequency detector 102, low pass filter 106 and VCO 108. However, reducing the lock-in time by merely a factor of two can introduce unacceptable jitter into the circuit at steady-state. It is desirable, therefore, to provide a circuit for generating internal clocking signals at the external clock frequency which is capable of resuming normal operation immediately following a power down state, a stopping of the external clock, or a change in the external clock frequency.

In addition, it is often necessary to provide multiple internal clocking signals at a given frequency with non-overlapping phases. Two active high clocking signals have overlapping phases if there exists an overlapping interval, $t_{OL}$, during which both signals are high. Accordingly, two active high clocking signals which are never high simultaneously have non-overlapping phases. For signals with non-overlapping phases, the non-overlapping interval, $t_{NOL}$, is defined as the delay from the trailing edge of one signal to the rising edge of the other. There are numerous advantages to providing two clocking signals having a single frequency and non-overlapping phases, such as the avoidance of contention in precharge circuits or the ensuring of correct propagation of data through successive latch stages.

Thus, what is desired is a circuit for generating, in response to an external clock, two clocking signals having a single frequency and non-overlapping phases, where the circuit is independent of the external clock duty cycle and is capable of immediate recovery after power management states.

SUMMARY OF THE INVENTION

A circuit for receiving an external clocking signal and, in response, generating two internal clocking signals with non-overlapping phases at the frequency of the external clocking signal is described. A first differentiator is coupled to receive a periodic external clocking signal EXT CLK and an enabling signal EN1. An output of the first differentiator is coupled to the S# input of an RS flip-flop having intrinsic overlap between its Q and Q# outputs. The Q output of the RS flip-flop is coupled to an input of a first inverter, which outputs a first internal clocking signal PH2. The Q# output of the RS flip-flop is coupled to an input of a second inverter, which outputs a second internal clocking signal PH1. The Q# output of the flip-flop is also provided to an input of a programmable delay line. An output of the programmable delay line is coupled to the input of a second differentiator and to an input of a wake-up circuit. The wake-up circuit is coupled to receive, in addition to the output of the delay line, an enabling signal EN2, and the output of the first differentiator. The wake-up circuit provides an output which is coupled to the input of a third differentiator. The second and third differentiators each provide outputs which are coupled to separate inputs of a two-input AND gate. The output of the AND gate is coupled to the R# input of the RS flip-flop.

An object of the present invention is to provide a circuit which generates from an input clocking signal two clocking signals which have non overlapping phases and have the same frequency as the input clocking signal.

Another object of the present invention is to provide a circuit for generating clocking signals which can resume normal operation within a maximum of two cycles of the external clocking signal after power management states.

Yet another object of the present invention is to provide a clocking circuit which generates clocking signals from an external clock which are not dependent upon the duty cycle of the external clocking signal.

Still yet another object of the present invention is to provide a circuit which is capable of generating internal clocking signals with duty cycles greater than 50%.

Still other objects and advantages of the present invention will be apparent from the detailed description which follows.

DETAILED DESCRIPTION OF THE INVENTION

The present invention discloses a circuit for generating two internal clocking signals with non-overlapping phases at the frequency of an input external clocking signal. In the following description, numerous specific details such as specific circuits and components are set forth in order to provide a thorough understanding of the present invention. It will be apparent to one skilled in the art, however, that the present invention may be practiced without these specific details. In other instances, well-known circuit elements have not been set forth in detail in order to not unnecessarily obscure the present invention.

Figure 1:
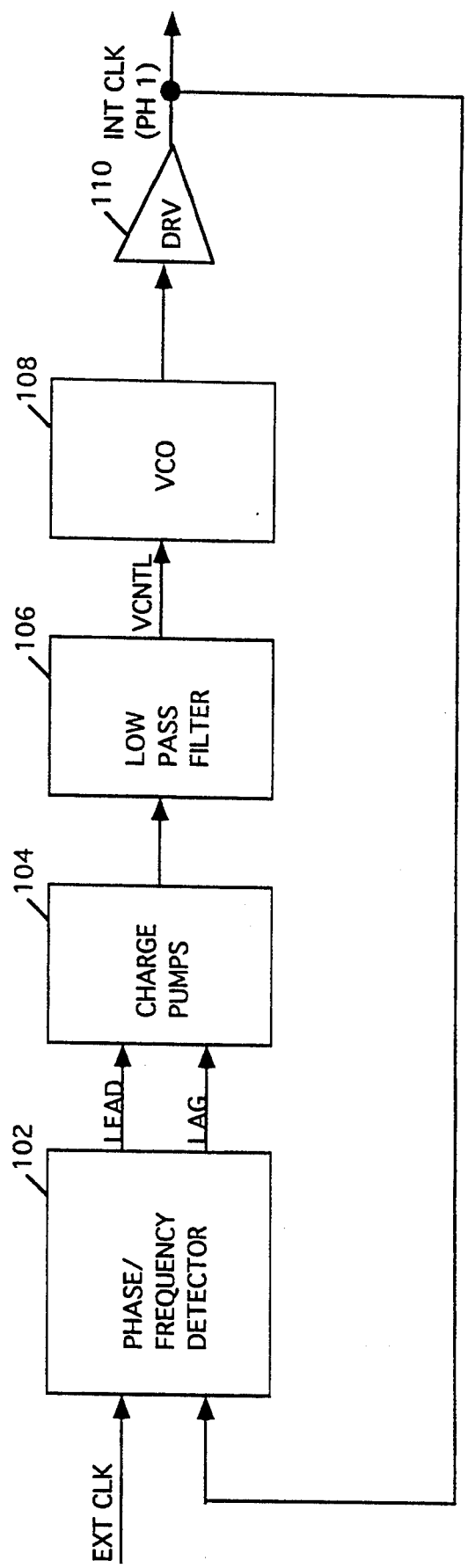
FIG. 1 is an illustration in block diagram form of a known arrangement for generating an internal clocking signal at the frequency of an input external clocking signal.
Figure 2:
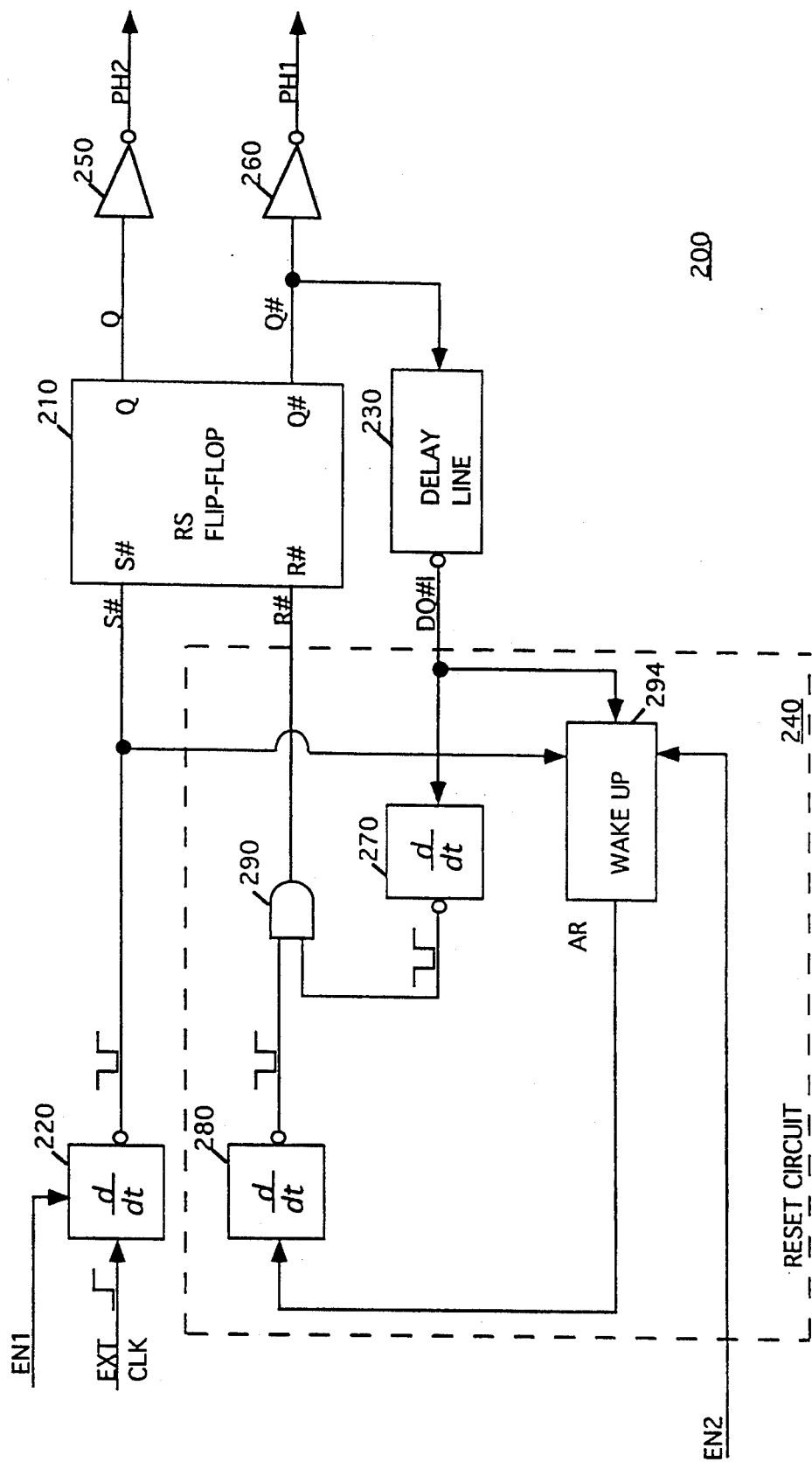
FIG. 2 is a block diagram of the preferred embodiment of the clock generating circuit of the present invention.

FIG. 2 shows a block diagram of circuit 200, which is the preferred embodiment of the present invention. Circuit 200 comprises a Nand gate RS flip-flop 210 having two active low inputs, S# and R#, and two intrinsically overlapping outputs, Q and Q#. Circuit 200 also comprises a differentiator 220, a programmable delay line 230, a reset circuit 240, and two inverters 250 and 260. Differentiator 220 is coupled to receive a periodic external clocking signal EXT CLK and an enabling signal EN1. The output of differentiator 220 is coupled to the S# input of RS flip-flop 210. The Q output of flip-flop 210 is coupled to inverter 250, which inverts and drives the first internal clocking signal PH2. The Q# output of flip-flop 210 is coupled to inverter 260, which inverts and drives the second internal clocking signal PH1. The Q# output of flip-flop 210 is also provided to an input of programmable delay line 230. The output of delay line 230 is signal DQ#I, which is a delayed and inverted version of Q#. DQ#I is provided to an input of the reset circuit 240. In addition to DQ#I, reset circuit 240 is coupled to receive the output of differentiator 220. Reset circuit 240 provides an output coupled to the R# input of the flip-flop 210.

In the preferred embodiment, reset circuit 240 comprises two differentiators 270 and 280, a two-input AND gate 290, and a wake-up circuit 294. Wake-up circuit 294 and differentiator 270 are both coupled to receive signal DQ#I from delay line 230. Wake-up circuit 294 is also coupled to receive an enabling signal EN2 as well as the output of differentiator 220. The output of wake-up circuit 294 provides the input to differentiator 280. The outputs of differentiators 270 and 280 provide the inputs to AND gate 290. The output of AND gate 290 is coupled to the R# input of RS flip-flop 210. As will be apparent from the discussion which follows, differentiator 280 may be appropriately viewed as part of wake-up circuit 294. It is discussed as a separate component in this description, however, in order to facilitate better understanding of the operation of the present invention.

Figure 3:
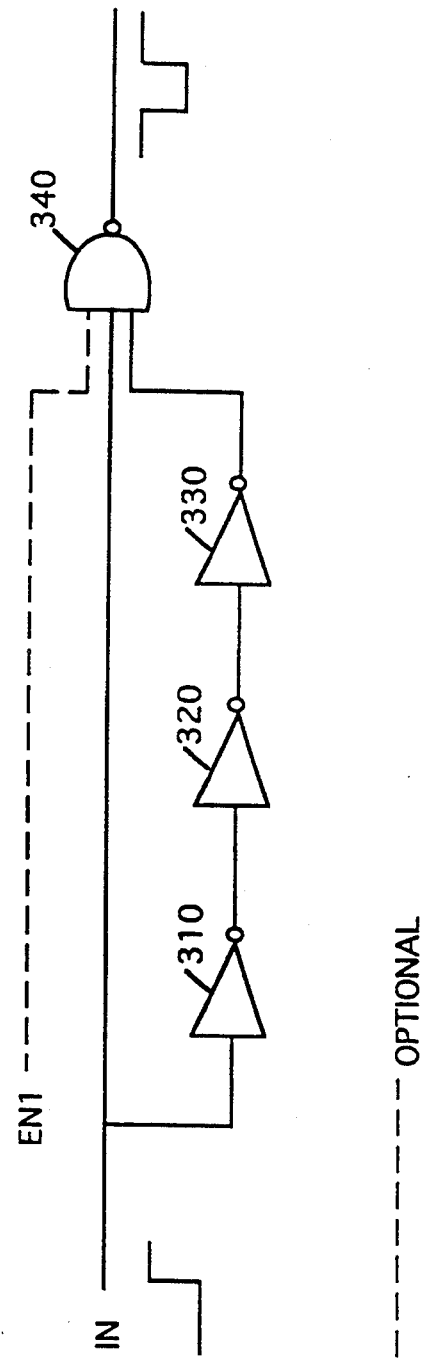
FIG. 3 is an illustration of a suggested implementation of the differentiator circuits depicted in FIG. 2.

Differentiators 220, 270 and 280 are identical in the preferred embodiment, with the exception that only differentiator 220 is coupled to receive enabling signal EN1. FIG. 3 illustrates a suggested implementation of differentiators 220, 270 and 280. The suggested implementation is comprised of a multiple input NAND gate 340 and three serially coupled inverters 310, 320 and 330. An input signal IN is provided to a first input of NAND gate 340 and to the input of inverter 310. The output of inverter 310 is coupled to the input of inverter 320. The output of inverter 320 is provided to the input of inverter 330. The output of inverter 330 is coupled to a second input of NAND gate 340. As already discussed, NAND gate may also be coupled to receive enabling signal EN1 as a third input.

Differentiators 220, 270 and 280 are essentially one-shots. However, because they will always generate an output pulse shorter than the input pulse, they can effectively be used as differentiators. The implementation of FIG. 3 outputs a logic 1 in the stable condition and provides a logic 0 pulse in response to a rising edge of the input signal IN. The duration of the logic 0 pulse is determined by the combined gate delays of inverters 310, 320 and 330. More specifically, NAND gate 340 outputs logic 1 whenever input signal IN is logic 0. A rising edge of input signal IN causes a logic 1 to be applied directly to the first input of NAND gate 340, causing the output of NAND gate 340 to transition to logic 0. The same rising edge of input signal IN also propagates successively through inverters 310, 320 and 330 until reaching the second input of NAND gate 340. When the rising edge of input signal IN reaches the second input of NAND gate 340, the output of NAND gate 340 transitions back to the stable state, logic 1. If the optional enable signal EN1 is used, a logic 0 applied to NAND gate 340 via enable signal EN1 will prevent NAND gate 340 from transitioning to a logic 0 output, thereby disabling the differentiator circuit.

Figure 4:
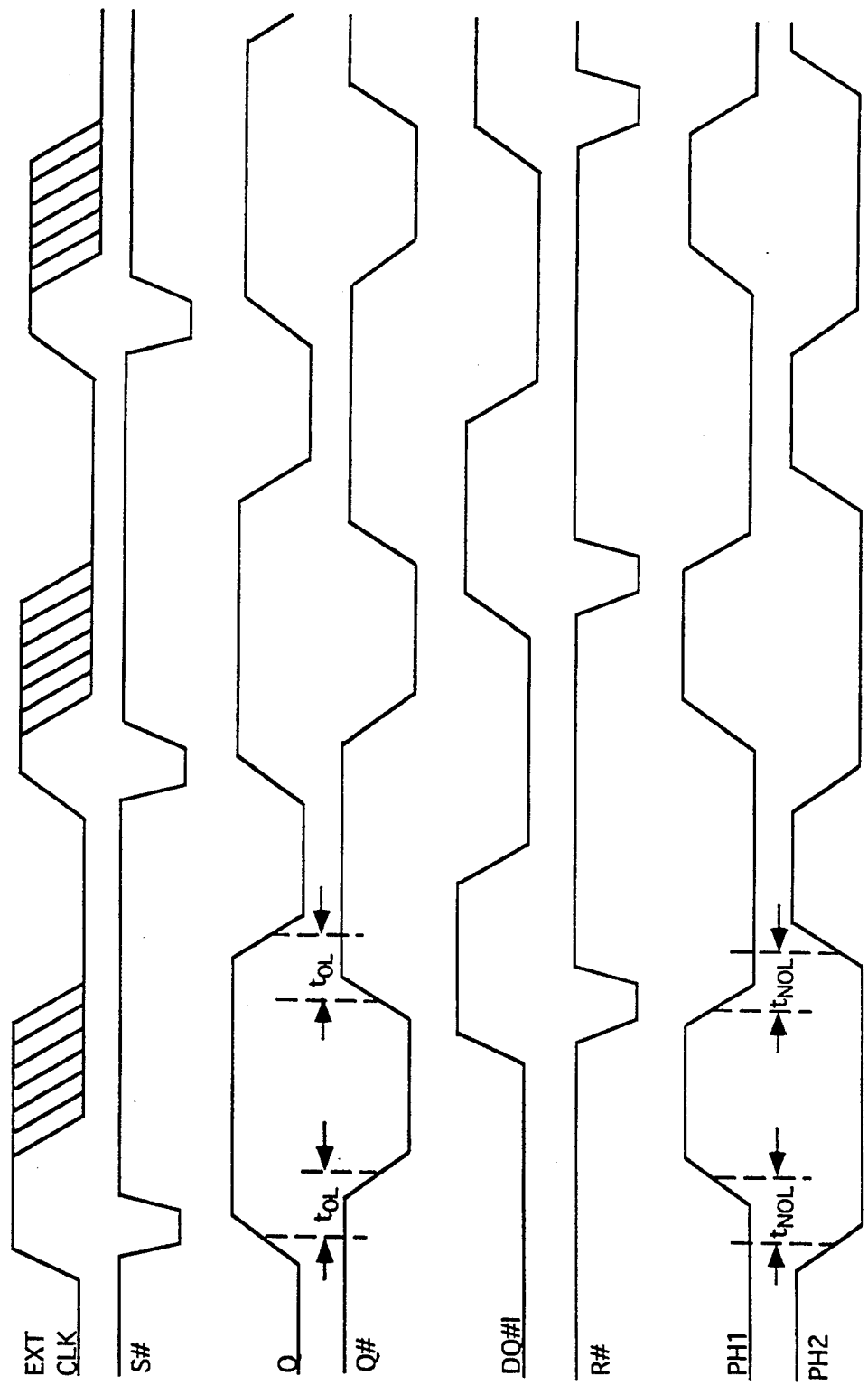
FIG. 4 is an illustration of the timing relationships between the various signals utilized in and generated by the circuit of the present invention.

FIG. 4 provides an illustration of the timing of the various signals utilized in circuit 200. Referring now to FIGS. 2 and 4, the entire circuit 200 functions as a one-shot, with the timing being determined primarily by the delay produced by programmable delay line 230. The delay generated by programmable delay line 230 is selected (programmed) by the user to meet the particular design criteria of the application in which the present invention is to be used.

Differentiator 220 provides a means for setting flip-flop 210 while also providing the desired immunity from the external clock duty cycle. In the preferred embodiment, the entire circuit 200 may be disabled during power down states by disabling differentiator 220 via enable signal EN1. When differentiator 220 is enabled, a rising edge of EXT CLK causes differentiator 220 to provide a logic 0 pulse on line S#. A logic 0 pulse on line S# sets flip-flop 210, causing the Q output of flip-flop 210 to go high. Consequently, the Q# output of flip-flop 210 goes low after an inherent delay determined by the gate delays within flip-flop 210. The inherent delay between the transitions of the Q and Q# outputs forms the overlap between signals Q and Q#. As shown in FIG. 4, the overlapping interval $t_{OL}$ is the time interval when signals Q and Q# are both high.

Reset circuit 240 provides a means for resetting flip-flop 210. Specifically, delay line 230 and differentiator 270 in combination provide a means for resetting flip-flop 210 during each cycle of the external clock, while wake-up circuit 294 and differentiator 280 in combination provide a means for resetting flip-flop 210 if flip-flop 210 "wakes up" in an inappropriate state (as will be discussed below). Delay line 230, which is coupled to receive Q#, inverts and delays Q# to produce signal DQ#I. Thus, a falling edge of Q# causes a rising edge to occur at the input of differentiator 270 after a delay determined by delay line 230. Differentiator 270 then generates a logic 0 pulse in response to the rising edge at its input. The presence of differentiator 270 in the feedback path provides the capability of the invention to generate clocking signals with duty cycles greater than 50%.

As stated, wake-up circuit 294 and differentiator 280 provide a means for resetting flip-flop 210 if flip-flop 210 "wakes up" in an inappropriate state. When power is first applied to circuit 200, flip-flop 210 may "wake-up" in either of two states: (Q=0, Q#=1) or (Q=1, Q#=0). If flip-flop 210 wakes up in the latter state, flip-flop 210 cannot subsequently be triggered by a pulse at its S# input. Consequently, wake-up circuit 294 samples DQ#I during every EXT CLK cycle in response to signal S# and outputs a logic 1 auto-reset pulse AR if DQ#I does not change state every EXT CLK cycle. A rising edge of pulse AR causes differentiator 280 to generate a momentary logic 0 pulse.

Wake-up circuit 294 may be supplied with an enable signal EN2, which allows wake-up circuit 294 to be selectively enabled or disabled in order to reduce power consumption. In the preferred embodiment, wake-up circuit 294 is enabled only when power is first applied to circuit 200. Circuits which perform the functions of wake-up circuit 294 are well-known in the art. Consequently, the details of wake-up circuit 294 need not be discussed in this description.

The outputs of differentiators 270 and 280 provide the inputs to AND gate 290. A logic 0 pulse from either differentiator 270 or differentiator 280 causes AND gate 290 to apply a logic 0 pulse to the R# input of flip-flop 210, causing the Q# output of flip-flop 210 to go high. Consequently, the Q output of flip-flop 210 goes low after an inherent delay $t_{OL}$, as discussed above.

Inverters 250 and 260 function as drivers of internal clocking signals PH2 and PH1, respectively, and transform the overlapping flip-flop outputs Q and Q# into non-overlapping signals (PH2 and PH1, respectively). As illustrated in FIG. 4, PH1 and PH2 are never high simultaneously. The overlapping interval $t_{OL}$ between Q and Q# is transformed by inverters 250 and 260 into the non-overlapping interval $t_{NOL}$ between PH1 and PH2.

Circuit 200 generates two internal clocking signals having non-overlapping phases at the frequency of an input external clocking signal. In addition, circuit 200 recovers within two external clock cycles from power management conditions including power down states, stopped external clock, or changes in the external clock frequency, while remaining independent of the external clock duty cycle. Further, circuit 200 is capable of generating internal clocking signals having duty cycles greater than 50%. The present invention is therefore useful in numerous applications, including timing circuits used in conjunction with "power down" techniques and applications where contention in precharge circuits and correct propagation of data through successive latch stages are of concern.

While the present invention has been described in terms of its presently preferred embodiment, those skilled in the art will recognize that the present invention may be practiced with modification and alternation within the spirit and scope of the appended claims. The specifications and drawings are, accordingly, to be regarded in an illustrative rather than a restrictive sense.

I claim:

1. A circuit for generating a first and a second clocking signal having non-overlapping phases, the circuit comprising:

a first differentiator having an input and an output, said input coupled to a first digital signal, said first differentiator generating a first digital pulse in response to a transition in logic state of said first digital signal and providing said first digital pulse on said output;

a flip-flop having a first input coupled to said output of said first differentiator wherein said flip-flop enters a first logic state upon receiving said first digital pulse at said first input; a second input coupled to receive a second digital pulse wherein said flip-flop enters a second logic state upon receiving said second digital pulse, a first output for outputting a second digital signal, and a second output for outputting a third digital signal wherein said third digital signal represents a binary complement of said second digital signal;

a first inverter having an input coupled to said first output of said flip-flop, said first inverter outputting the first clocking signal;

a delay circuit having an input coupled to said second output of said flip-flop, said delay circuit generating on an output a fourth digital signal representing a binary complement of said third digital signal, the delay circuit causing said fourth digital signal to be delayed with respect to said third digital signal by a first predetermined amount of time;

a second differentiator having an input coupled to said output of said delay circuit said second differentiator generating on an output said second digital pulse in response to a transition in the logic state of said fourth digital signal and said output of said second differentiator coupled to said second input of said flip-flop; and a second inverter having an input coupled to said second output of said flip-flop, said second inverter outputting the second clocking signal;

2. The circuit of claim 1 further comprising:

a wake up circuit having a first input coupled to said output of said delay circuit, a second input coupled to said output of said first differentiator, said wake up circuit outputting a third digital pulse when said third digital signal does not change logic state for a second predetermined amount of time, said output of said wake up circuit coupled to said second input of said flip-flop wherein upon receiving said third digital pulse said flip-flop enters said second state.

3. The circuit as set forth in claim 2, wherein the flip-flop is an RS flip-flop.

4. The circuit as set forth in claim 3 wherein said flip-flop has an intrinsic overlap between said first output of said flip-flop and said second output of said flip-flop.

5. The circuit as set forth in claim 2, wherein said first digital signal is periodic and said second predetermined period of time is based on a predetermined number of cycles of said first digital signal.

6. The circuit as set forth in claim 2, wherein said first digital pulse is a pulse representing a low logic level, wherein said second digital pulse is a pulse representing a low logic level, and wherein said third digital pulse is a pulse representing a low logic level.

7. The circuit as set forth in claim 1, wherein said first digital signal is periodic.

8. The circuit as set forth in claim 1, wherein said first digital pulse and said second digital pulse are generated in response to a transition from a low logic level to a high logic level of said first digital signal and said fourth digital signal, respectively.

9. The circuit as set forth in claim 1, wherein the circuit further comprises means for enabling the circuit.

10. A clock generation circuit comprising:
a differentiator generating a first digital pulse in response to a transition in logic state of a first digital signal provided to said differentiator;
a flip-flop entering a first logic state upon receiving said first digital pulse and entering a second logic state upon receiving a second digital pulse, said flip-flop generating a second digital signal on a first output and a third digital signal on a second output, said third digital signal representing the binary complement of said second digital signal;
a first inverter coupled to receive said second digital signal, said first inverter generating a first clocking signal in response to said second digital signal, said first clocking signal representing the binary complement of said second digital signal;
a second inverter coupled to receive said third digital signal, said second inverter generating a second clocking signal in response to said third digital signal, said second clocking signal representing the binary complement of said third digital signal; and
a reset circuit coupled to receive said third digital signal, said reset circuit generating said second digital pulse in response to a transition in logic state of said third digital signal.

11. The clock generation circuit of claim 10, wherein said reset circuit further generates said second digital pulse if said third digital signal does not change logic state for a predetermined period of time.

12. The clock generation circuit of claim 11, wherein an intrinsic overlap exists between said second digital signal and said third digital signal.

13. The clock generation circuit of claim 12, wherein said flip-flop is an RS flip-flop.

14. The clock generation circuit of claim 13, wherein said first digital signal is periodic.

15. The clock generation circuit of claim 14, wherein said first digital pulse is a pulse representing a low logic level and said second digital pulse is a pulse representing a low logic level.

16. The clock generation circuit of claim 15, wherein said differentiator generates said first digital pulse in response to a transition of said first digital signal from a low logic level to a high logic level.

17. The clock generation circuit of claim 16, wherein said reset circuit generates said second digital pulse when said transition in logic state of said third digital signal is from a high logic level to a low logic level.

18. The clock generation circuit of claim 11, wherein said reset circuit comprises a wake-up circuit generating said second digital pulse if said third digital signal does not change logic state for a predetermined period of time.

19. The clock generation circuit of claim 18, wherein said wake up circuit is coupled to said differentiator.

20. The clock generation circuit of claim 19, wherein said differentiator comprises:
an input receiving said first digital signal;
an output providing said first digital pulse;
a nand gate having a first and a second input, said first input of said nand gate connected to said input of said differentiator; and
a delay line coupled between said input of said differentiator and said second input of said nand gate.

21. The clock generation circuit of claim 10, further comprising an enabling circuit inhibiting and allowing said clock generation circuit from generating said first and second clocking signals.

22. The clock generation circuit of claim 21, wherein said first digital signal is periodic and said predetermined period of time is based on a predetermined number of cycles of said first digital signal.

* * * * *